United States Patent
Yoshida et al.

(10) Patent No.: US 6,531,349 B2
(45) Date of Patent: Mar. 11, 2003

(54) METHOD OF ETCHING POLYCRYSTALLINE SILICON FILM BY USING TWO CONSECUTIVE DRY-ETCHING PROCESSES

(75) Inventors: Kazuyoshi Yoshida, Tokyo (JP); Nobuyuki Ikezawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/790,075

(22) Filed: Feb. 21, 2001

(65) Prior Publication Data

US 2002/0115276 A1 Aug. 22, 2002

(30) Foreign Application Priority Data

Feb. 21, 2000 (JP) ........................... 2000-043005

(51) Int. Cl.[7] ............................. H01L 21/336
(52) U.S. Cl. ................... 438/197; 438/299; 438/585; 438/706; 438/734
(58) Field of Search ............... 438/197, 299, 438/585, 695, 706, 711, 712, 714, 719, 734, 753

(56) References Cited

U.S. PATENT DOCUMENTS

| 5,259,923 A | 11/1993 | Hori, et al. |
| 6,069,091 A | * 5/2000 | Chang et al. ............... 438/719 |
| 6,194,284 B1 | * 2/2001 | Chen ........................... 438/424 |

FOREIGN PATENT DOCUMENTS

| JP | 04-096223 | 3/1992 |
| JP | 06-283477 | 10/1994 |
| JP | 08-306672 | 11/1996 |
| JP | 11-260799 | 9/1999 |
| TW | 357411 | 5/1999 |

* cited by examiner

*Primary Examiner*—Olik Chaudhuri
*Assistant Examiner*—Jack Chen
(74) *Attorney, Agent, or Firm*—Katten, Muchin, Zavis Roseman

(57) ABSTRACT

A method for fabricating a semiconductor device including the steps of: sequentially forming an oxide film and a polycrystalline silicon film overlying a substrate; and selectively dry-etching the polycrystalline silicon film in consecutive two processes including a main etching process for dry-etching the polycrystalline silicon film under existence of $Cl_2$, HBr and $CF_4$ and an over-etching process for dry-etching the polycrystalline silicon film under existence of HBr and oxygen. In the process, the polycrystalline silicon film is etched in the main etching process with the excellent dimension controllability and is etched in the over etching process with the higher selective ratio between the polycrystalline silicon film and the gate oxide film.

3 Claims, 7 Drawing Sheets

PRE-ETCHING

POST-ETCHING

METHOD OF ETCHING POLYCRYSTALLINE SILICON FILM BY USING TWO CONSECUTIVE DRY-ETCHING PROCESSES

BACKGROUND OF THE INVENTION (a) Field of the Invention

The present invention relates to a method for fabricating a semiconductor device, more in detail to the method for fabricating the semiconductor device suitably used for formation of a gate electrode of MOSFET.

(b) Description of the Related Art

With higher integration of a semiconductor device, a technology is developed in which the dimensions of the gate electrode of the MOSFET are reduced to have a narrower width thereof than a minimum width of a conventional gate electrode formed by the photolithographic technology currently utilizable. In the developed technology, the gate electrode is formed by patterning, by using the photolithography and dry-etching, of a polycrystalline silicon film deposited on a gate insulation film. After the polycrystalline silicon film is etched until the thickness thereof is reduced to a specified thickness in a main etching process in which a selective ratio between the polycrystalline silicon film and the gate oxide film ($SiO_2$) is low, the etching is continued to the surface of the gate oxide film in an over etching process in which the selective ratio is higher.

However, when the gate electrode is formed in accordance with the above technology by using the dry etching, problems such as the irregularity of the pattern size, and the in-plane difference in shape, arise due to the difference of the pattern density on the wafer.

JP-A-11(1999)-260799 describes a method of processing a finely-deposited thin layer for overcoming the above problem. The method will be described referring to FIG. 1.

As shown therein, an oxide film ($SiO_2$ film) 302 having a thickness of 3 nm, a doped polycrystalline silicon (DOPOS) film 303 having a thickness of 200 nm 303, and a silicon nitride film 304 are sequentially deposited on a silicon substrate 301. The silicon nitride film 304 is photolithographically formed, and has the minimum width of 0.13 μm.

The DOPOS film 303 is etched in a plurality of steps by using the silicon nitride film 304 as a mask. In a first step, a native oxide film generated on the DOPOS film is removed by means of etching for 5 seconds under the conditions that chlorine gas is provided at a flow rate of 120 ml/min under an ambient pressure of 0.1 Pa, an RF electric power of 160 mW and a microwave power of 500 mW. In a second step or a main etching step, the etching of the DOPOS film 303 is conducted at a lower selective ratio between the DOPOS film 303 and the oxide film 302 at a chlorine flow rate of 108 ml/min and an oxygen flow rate of 12 ml/min.

The remaining thickness of the DOPOS film 303 during the main etching step is measured by using an optical interference real time monitor for film thickness, and the second step is finished and a third step or an over-etching step starts when the film thickness reaches to 30 nm. In the over-etching step, in order to increase the selective ratio between the DOPOS film 303 and the oxide film 302, an oxygen flow rate and a HBr flow rate are established to be 3 ml/min and 100 ml/min., respectively.

The combination of the main etching step having the lower selective ratio between the DOPOS film 303 and the oxide film 302 and the over etching step having the higher selective ratio for the etching of the DOPOS film 303 prevents the occurrence of etching damage in the gate oxide film 302. Especially, the measurement of the film thickness with the optical interference real time monitor controls the conversion from the main etching step to the over etching step in accordance with the remaining DOPOS film thickness.

However, in the method for forming the finely-deposited thin layer described in the above publication, an undesired sub-trench is formed in the DOPOS film due to the difference of the pattern densities on the wafer, thereby generating the difference in the film thickness of the remaining DOPOS film.

As shown in FIG. 2A, the small sub-trench 305 is generated on the sidewall portions of the DOPOS film 303 especially in an area where a pattern density is large during the main etching. As shown in FIG. 2B, the sub-trench 305 proceeds toward the surface of the gate oxide film 302 at the time of the completion of the main etching, and thereafter, proceeds toward the surface of the substrate 301 in the succeeding over etching step, thereby generating damages on the substrate surface as shown in FIG. 2C, that is, deteriorating the characteristics of the MOSFET.

The reasons of generating the sub-trench include the increase of the ion density at the periphery of the gate electrode due to the reflection of the ions on the sidewalls of the photoresist and the nitride film, and especially the electron shading may provide an influence to the incident orbits of the ions in the region where the pattern density is high. The generation of the sub-trenches is affected by a deposition seed, and an amount thereof or the degree of covering the film. As a result, the irregularity of the remaining DOPOS film is largely influenced thereby. However, an effective means for suppressing the irregularity is not conventionally proposed.

SUMMARY OF THE INVENTION

In view of the foregoing, an object of the present invention is to provide a method for fabricating a semiconductor device, especially the method for patterning a gate electrode of MOSFET in which damage due to etching of a substrate and a gate oxide film is hardly generated in the fabrication of the semiconductor device.

Thus, the present invention provides a method for fabricating a semiconductor device including the steps of: sequentially forming an oxide film and a polycrystalline silicon film overlying a substrate; and selectively dry-etching the polycrystalline silicon film in consecutive two processes including a main etching process for dry-etching the polycrystalline silicon film under existence of $Cl_2$, HBr and $CF_4$ and an over-etching process for dry-etching the polycrystalline silicon film under existence of HBr and oxygen.

In accordance with the present invention, the gate electrode film is etched in the main etching process with the excellent dimension controllability and is etched in the over etching process with the higher selective ratio between the gate electrode film and the gate oxide film. In the main etching process, the halogen-containing gas such as $CF_4$ is deposited in the sub-trenches formed during the process. Accordingly, the sub-trenches in the polycrystalline silicon film are diminished to make uniform the thickness of the polycrystalline silicon film after the main etching process. The uniform film thickness prevents the damages liable to occur in the oxide film and on the substrate surface in the succeeding over etching process.

The above and other objects, features and advantages of the present invention will be more apparent from the following description.

PREFERRED EMBODIMENTS OF THE INVENTION

Figure 1:
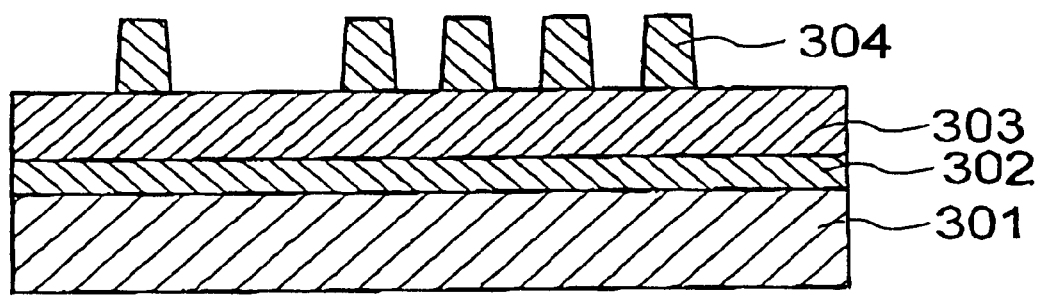
FIG. 1 is a longitudinal sectional view showing a conventional gate electrode.
Figure 2A:
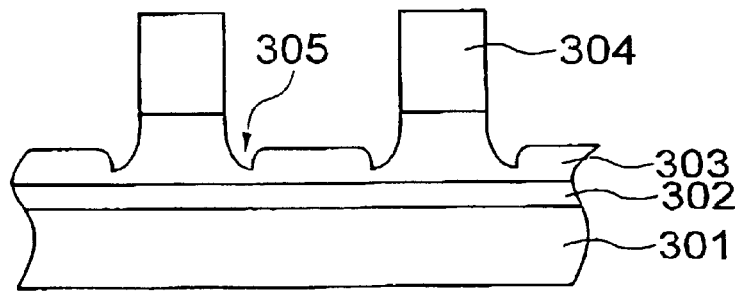
FIGS. 2A to 2C are longitudinal sectional views of a semiconductor device sequentially showing a conventional method for fabricating the semiconductor device.
Figure 2B:
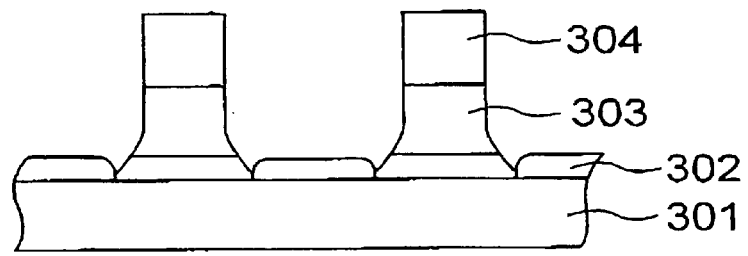
Figure 2C:
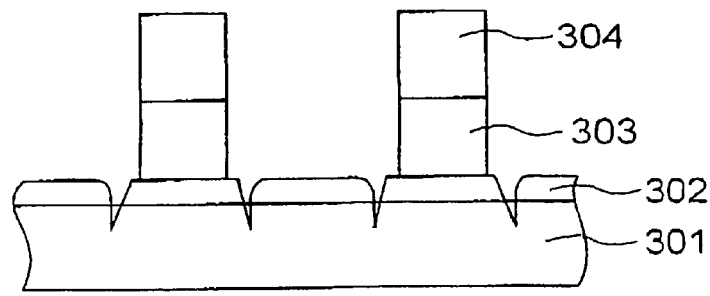
Figure 3A:
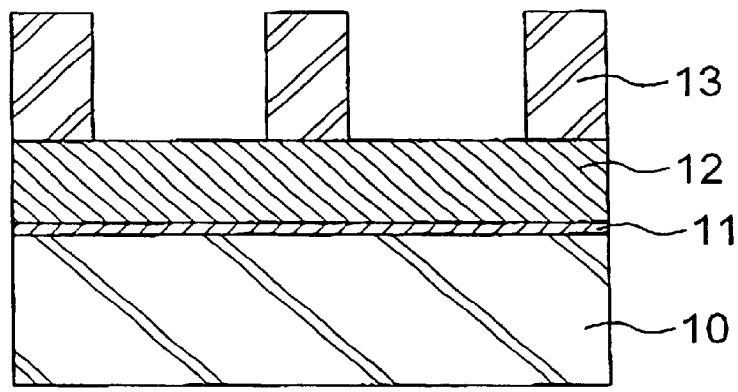
FIGS. 3A to 3C are longitudinal sectional views of a semiconductor device sequentially showing a method for fabricating the semiconductor device in accordance with an Embodiment of the present invention.
Figure 3B:
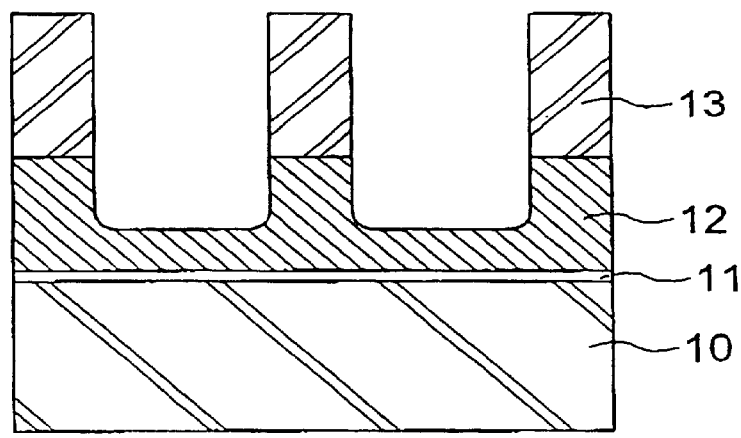
Figure 3C:
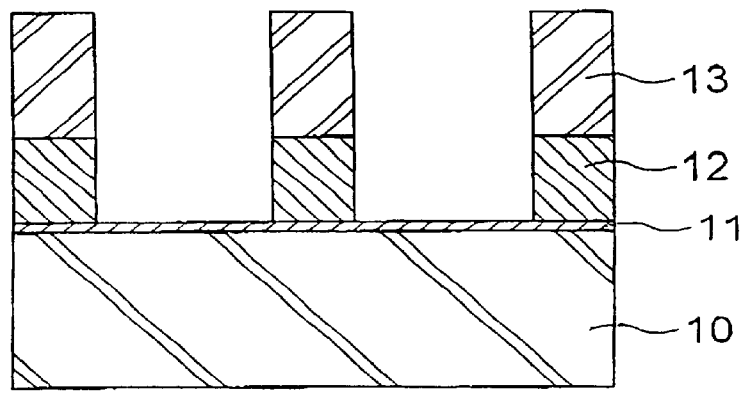

Now, the present invention is more specifically described with reference to accompanying drawings.
Embodiment As shown in FIG. 3A, a silicon oxide film 11 having a thickness of 60 Å, a gate electrode film 12 having a thickness of 1500 Å are sequentially deposited on a silicon substrate 10. A photoresist film 13 is applied thereon and photolithographically patterned. The gate electrode film 12 is made of, for example, a doped polycrystalline silicon (DOPOS) film.

Then, a native oxide film generated on the DOPOS film 12 is removed by means of etching for 5 seconds under the conditions that chlorine gas is provided at a flow rate of 50 sccm, a wafer stage temperature (substrate temperature) is 60° C., an ambient pressure is 5 mTorr, a source power is 200 W and a bias power is 100 W.

Then, a main etching step starts for dry-etching the gate electrode film (DOPOS film) 12. The main etching step is conducted under conditions that that chlorine gas, HBr gas and $CF_4$ gas are provided at flow rates of 50 sccm, 90 sccm and 40 sccm, respectively, an ambient pressure is 5 mTorr, a source power is 300 W and a bias power is 60 W. Under the conditions, the etch rate of the gate electrode film 12 is 1700 Å and the uniformity is ±4.4%, and the selective ratio between the gate electrode film 12 and the gate oxide film 11 is about 4. In this manner, the dimension controllability of the gate electrode 12 is improved by reducing the selective ratio. Or the sidewalls of the gate electrode 12 are upright, and even the gate electrode having a:width of 0.1 μm or less can be formed with the improved dimension controllability.

The preferable flow rate of the $CF_4$ gas in the main etching process is between 30 and 50 sccm and the preferable ambient pressure is between 5 and 15 mTorr. In this situation, the formation of the sub-trenches can be prevented more effectively with higher throughput. The flow rate below 30 sccm cannot efficiently suppress the formation of the sub-trenches, and that over 50 sccm may generate the irregularity in the dimensions of the gate electrode.

The remaining film thickness of the gate electrode 12 is measured while the main etching is conducted. The measurement of the film thickness is conducted under real-time processing by using an optical interferometer. When the signal of the optical interferometer changes to a specified extent, the remaining film thickness of the gate electrode 12 is, for example, 100 Å at minimum and 230 Å at maximum which is judged to be in a preferable range, thereby converting to and starting the over etching step. The etching of the over etching step is conducted for about 45 seconds under conditions that HBr gas and oxygen gas are provided at flow rates of 150 sccm and 1.5 sccm, respectively, an ambient pressure is 60 mTorr, a source power is 250 W and a bias power is 75 W. Under the conditions, the etch rate of the gate electrode film 12 is 1200 Å and the uniformity is ±3.4%, and the selective ratio between the gate electrode 12 and the gate oxide film 11 is as high as 200 or more.

The preferable ambient pressure in the over etching process is 50 mTorr or more and the flow rates of the HBr gas and the oxygen in the over etching process are between 100 and 200 sccm and between 1 and 3 sccm, respectively. In this situation, the selective ratio between the oxide film and the polycrystalline silicon film can be higher to further reduce the damages to the oxide film. The photoresist film or the silicon nitride film is used as a mask for etching the polycrystalline silicon film.

At the time of the completion of the over etching step, the gate electrode 12 has been completely etched by the use of the higher selective ratio in the over etching step, and almost all the gate oxide film 11 remains exposing to the surface thereof. The surface of the substrate 10 is protected with the gate oxide film 11, thereby reducing the damage generated on the surface of the substrate.

As described above, if the remaining minimum film thickness of the gate electrode 12 is established to be 100 Å when the main etching step is converted into the over etching step, the remaining film thickness of the gate electrode 12 is about 230 Å at maximum due to the slowest etch rate under the uniform conditions of the main etching step. When the thick gate electrode 12 remains in the main etching step, the uprightness of the sidewalls of the gate electrode is deteriorated due to the succeeding over etching with the higher selective ratio. Therefore, while the thickness of the remaining gate electrode 12 is preferably reduced as much as possible, the thickness of "zero" at the time of completion of the main etching step to damage the gate oxide film 11 must be prevented. Once the excellent uprightness of the sidewalls of the gate electrode 12 is obtained in the main etching step, the excellent uprightness is maintained in the succeeding over etching step. According to experiments, a length of time required for the desired film thickness of the gate electrode in the main etching step was 45 seconds under the above conditions.

Figure 4:
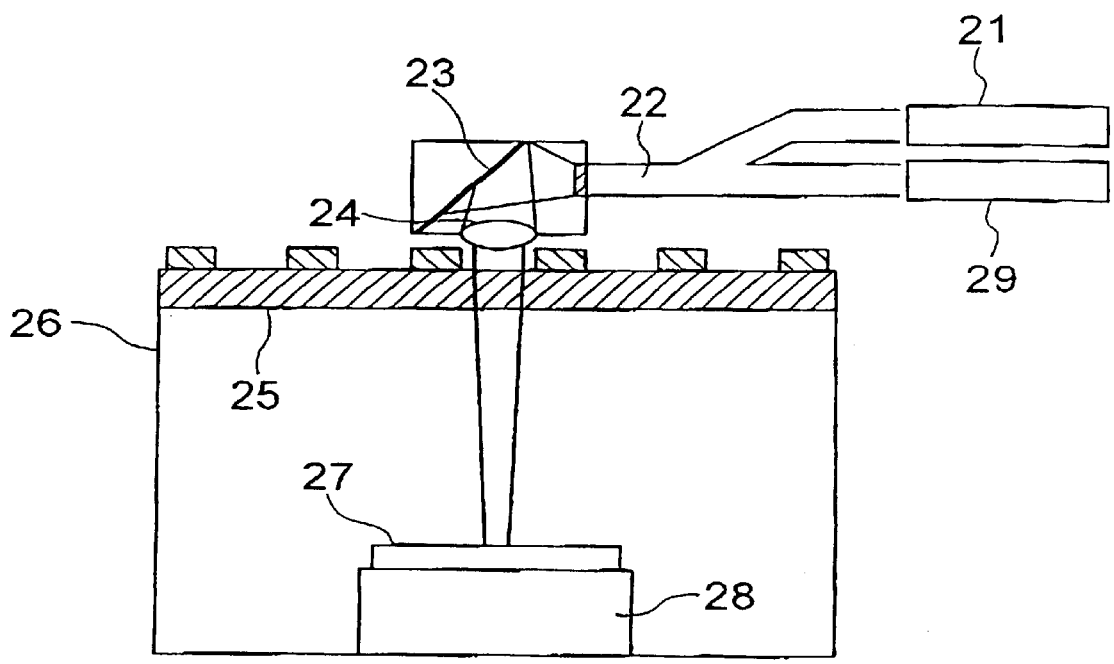
FIG. 4 is a schematic sectional view showing how a thickness is measured by using an optical interfere real time monitor for film thickness.

In an optical interferometer shown in FIG. 4, a ray from a mercury lamp 21 is irradiated on a mirror 23 by using optical fibers 22, and a reflected ray from the mirror 23 is projected, through intermediary of a lens 24 and a quartz window 25, on a wafer 27 on a bottom electrode 28 in an etching chamber 26. A ray reflected from the wafer 27 is again irradiated, through intermediary of the quartz window 25 and the lens 24, on the mirror 23, and a reflected ray from the mirror 23 is incident to an interfere detector 29 through intermediary of the optical fibers 22. The existence of the interference is detected by the interfere detector 29 between the ray reflecting on the surface of the optically transparent polycrystalline silicon film forming the gate electrode film on the wafer 27 and the ray permeating the polycrystalline silicon film and reflecting on the reverse surface thereof.

The interference was measured in the main etching step by changing wavelengths of the projected rays to determine the wavelength generating an excellent optical interference signal. The observed results of the optical interference were shown in graphs of FIGS. 5 to 7 occurring when the gate electrode film having a thickness of 1500 Å was etched by using rays having thicknesses of 245 nm, 365 nm ands 435 nm, respectively. Each of the graphs shows the relation between the etching time (sec, abscissa) and the strength of observed interference signal (arbitrary unit, ordinate). In each of the graphs, the strength of the plasma emission is also shown. Each of the observations continued until the polycrystaline silicon was completely etched.

Figure 5:
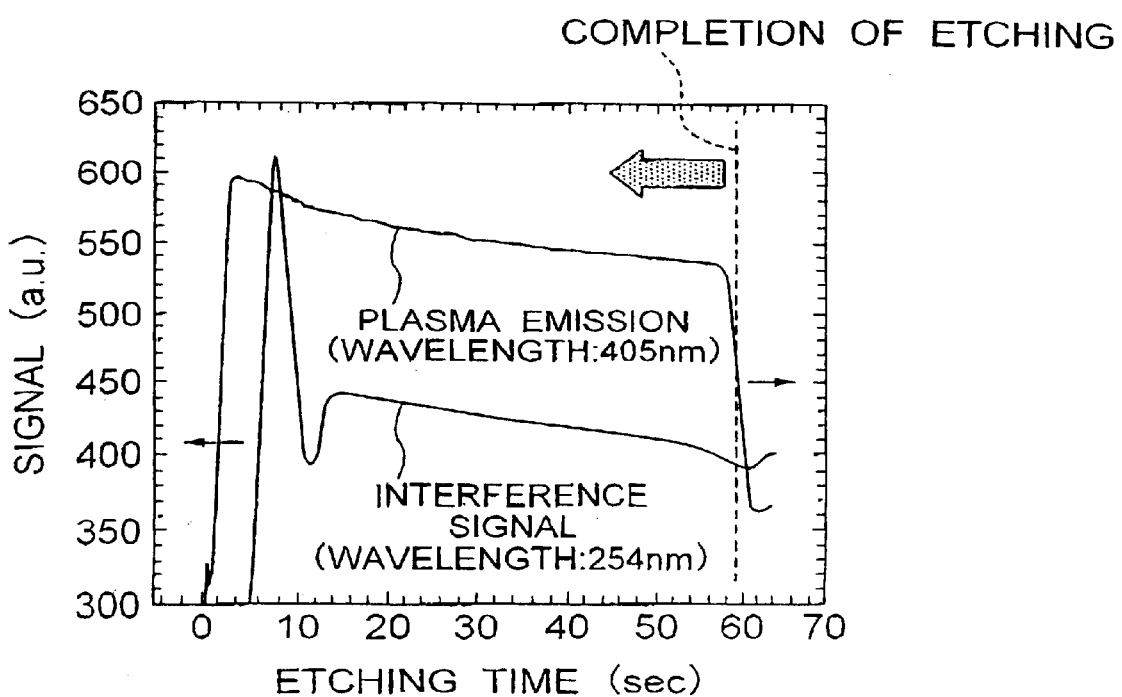
FIG. 5 is a graph showing an output of an optical interfere real time monitor using a ray of 254 nm wavelength.
Figure 6:
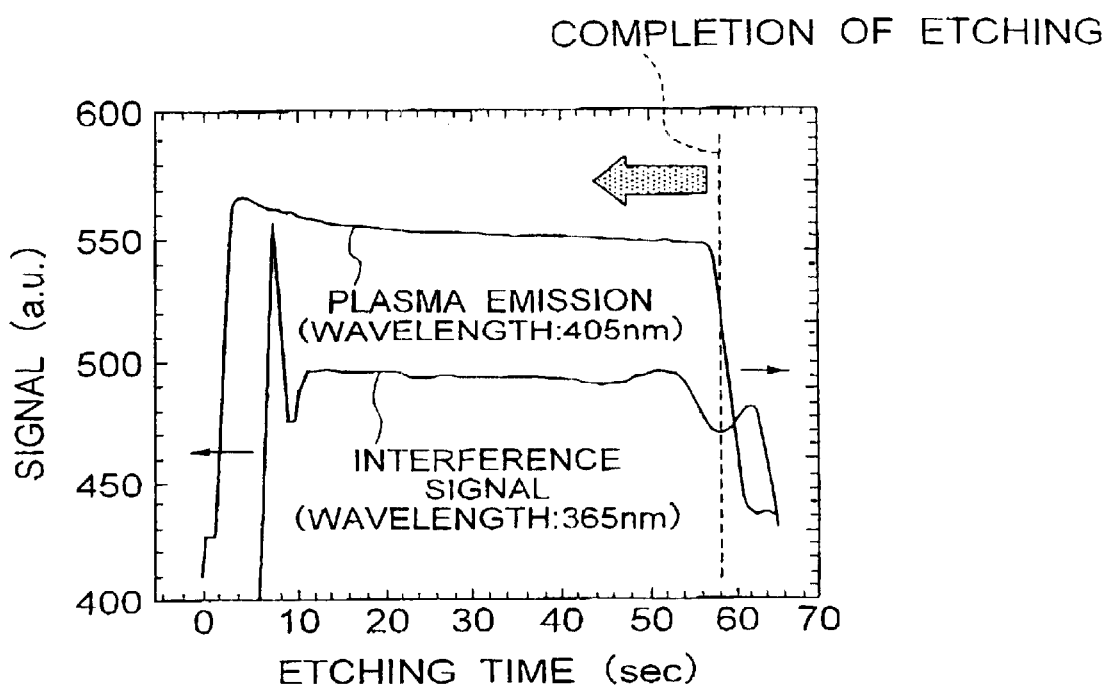
FIG. 6 is a graph showing an output of an optical interfere real time monitor using a ray of 365 nm wavelength.
Figure 7:
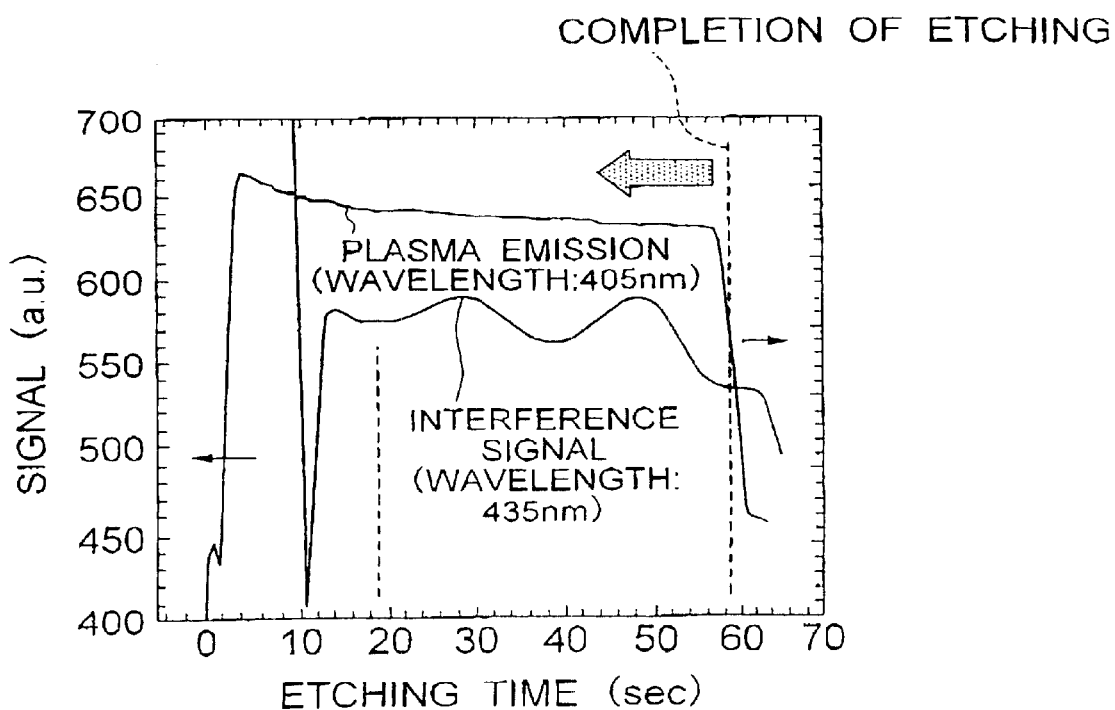
FIG. 7 is a graph showing an output of an optical interfere real time monitor using a ray of 435 nm wavelength.

Among the results of FIGS. 5 to 7, in the interference observation shown in FIG. 5 using the wavelength of 254, no effective optical interference signal could not be obtained. It was estimated that the deposit on the inner surface of the quartz window 25 of the etching chamber 26 did not produce the effective signal.

In the graph of FIG. 6, it is understood that interference signal generating after the lapse of about 40 seconds from the start of the etching indicated the conversion of the etching by the backward counting from the point the polycrystalline silicon was completely etched. The maximum remaining film thickness of the polycrystalline silicon in this stage was 500 Å, and the time of the conversion of the etching step was detected relatively effectively.

In the graph of FIG. 7, the interference signal generated after the lapse of about 20 seconds from the start of the etching, and the maximum remaining film thickness of the polycrystalline silicon in this stage was 1000 Å. The detected signal was improper for showing the timing of the conversion. Accordingly, it is understood that the ray having the thickness of 435 nm could not provide the effective interference signal.

Based on the above observation results, the timing of the conversion of the etching step (end point) could be effectively detected by using the ray having the wavelength of 365 nm.

Figure 8:
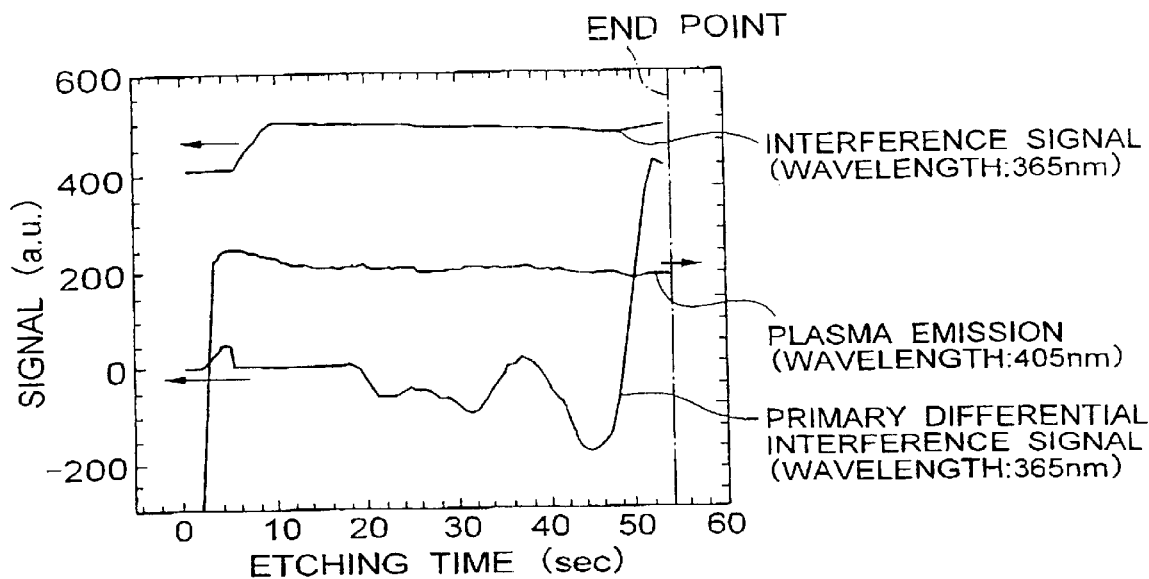
FIG. 8 is a graph showing an output of an optical interfere real time monitor using a ray of 254 nm wavelength.
Figure 9A:
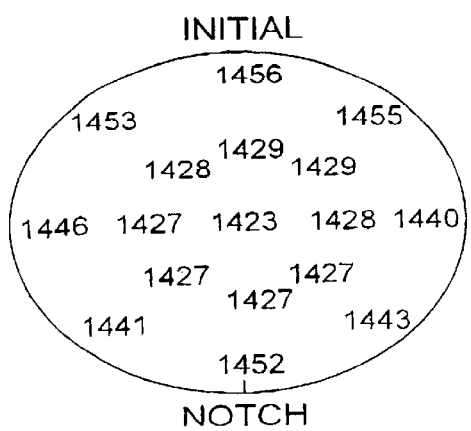
FIGS. 9A and 9B are schematic top plan views showing film thickness distribution at the end point shown in FIG. 8 compared with original distribution.
Figure 9B:
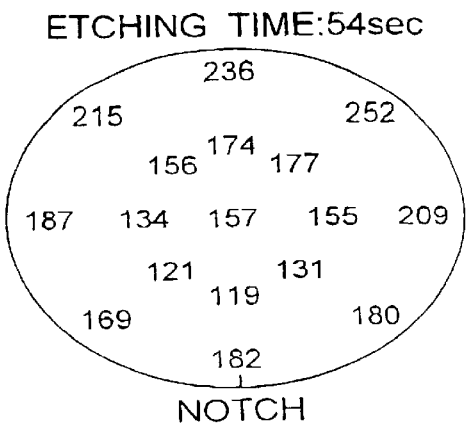

As shown in a graph of FIG. 8 showing a differential signal obtained by primary differential calculus observed by using a ray having a wavelength of 365 nm when a polycrystalline silicon film having a thickness of 1000 Å was etched, the end point indicating the timing of converting the etching step appeared after the lapse of 54 seconds from the start of the etching. The results of measuring the film thickness distributions before and after the main etching step were shown in FIG. 9A illustrating the film thickness distribution of the original gate electrode before the etching and in FIG. 9B illustrating the film thickness distribution at the end point. The film thickness at the end point was between 119 and 174 Å, and its average was 252 Å. From these results, it is understood that the end point could be detected quite effectively when the differential signal obtained by primarily differentiating the optical signal observed by using the ray having the wavelength of 365 nm.

In the above native oxide film removing step in the gate electrode forming process, though the chlorine gas is used as the etching gas, for example, $CF_4$ gas having a flow rate of 100 sccm may be used in place thereof.

EXAMPLE

An exemplified method of the present invention and a conventional method were compared with each other, in each of which a line width and a space were 0.18 μm and 0.24 μm, respectively.

The conventional method was conducted as follows. The etching in the native oxide film removing step was conducted for about 5 seconds under conditions that that chlorine gas was provided at a flow rate of 50 sccm, an ambient pressure was 5 mTorr, and a source power and a bias power were 200 W and 100 W, respectively. The etching in the main etching step was conducted, until the conversion to the over etching, under conditions that that chlorine gas, HBr gas and oxygen were provided at flow rates of 100 sccm, 150 sccm and 3 sccm, an ambient pressure was 10 mTorr, and a source power and a bias power were 300 W and 25 W, respectively. As a result, the period of the etching time in the main etching was 45 seconds. The etching in the over etching step was conducted for 45 seconds under conditions that that HBr gas and oxygen were provided at flow rates of 150 sccm and 1.5 sccm, an ambient pressure was 60 mTorr, a source power and a bias power were 250 W and 75 W, respectively, and a substrate temperature was 60° C.

The exemplified method of the present invention was conducted as follows. The etching in the native oxide film removing step was conducted under the conditions substantially same as those of the conventional method. The etching in the main etching step was conducted for 45 seconds under conditions that that chlorine gas, HBr gas and oxygen were provided at flow rates of 50 sccm, 90 sccm and 40 sccm, an ambient pressure was 5 mTorr, and a source power and a bias power were 300 W and 60 W, respectively. The etching in the over etching step was conducted for 5 seconds under conditions that that HBr gas and oxygen were provided at flow rates of 150 sccm and 1.5 sccm, an ambient pressure was 60 mTorr, a source power and a bias power were 250 W and 75 W, respectively, and a substrate temperature was 60° C.

Figure 10A:
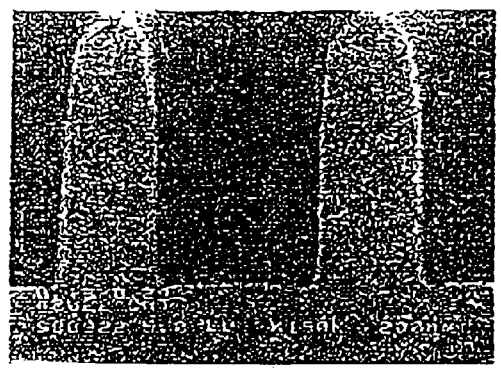
FIGS. 10A to 10D are scanning microphotographs comparing sectional shapes of a gate electrode in Example with those of Comparative Example.
Figure 10B:
Figure 10C:
Figure 10D:
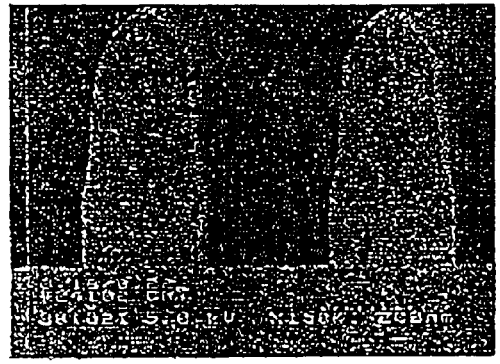

The observation results were shown in FIGS. 10A to 10D in which FIGS. 10A and 10B show the shapes of the gate electrodes of the conventional method after the main etching and after the over etching, respectively, and FIGS. 10C and 10D show the shapes of the gate electrodes of the exemplified method of the invention after the main etching and after the over etching, respectively.

In the gate electrode fabricated in accordance with the conventional method, the formation of the side etching and the etched shape formed by sawing and especially subtrenches in the area having the higher pattern density was observed after the main etching. Based on this, the etched shape formed by sawing was observed after the over etching.

On the other hand, in the gate electrode fabricated in accordance with the method of the invention, the formation of the side etching, the etched shape formed by sawing and the sub-trenches was not observed after the main etching. Accordingly, the gate electrode having the excellent upright sidewalls could be obtained The preferable etching conditions of the present invention in the main etching step includes the $CF_4$ flow rate between 30 and 50 sccm and the ambient pressure of 10 mTorr or more. The preferable etching conditions of the present invention in the over etching step includes the ambient pressure of 50 mTorr or more, the flow rates of the HBr and the oxygen between 100 and 200 sccm and between 1 and 3 sccm, respectively. In accordance with these conditions, the gate electrode could be obtained having a width of 0.1 μm having the preferable shape and dimension controllability.

Since the above embodiments are described only for examples, the present invention is not limited to the above embodiments and various modifications or alterations can be easily made therefrom by those skilled in the art without departing from the scope of the present invention.

What is claimed is:

1. A method for fabricating a semiconductor device comprising the steps of:

sequentially forming an oxide film and a polycrystalline silicon film overlying a substrate; and selectively dry-etching the polycrystalline silicon film in consecutive two processes including a main etching process for dry-etching the polycrystalline silicon film under existence of $Cl_2$, HBr and $CF_4$, the thickness of the polycrystalline silicon film being a minimum of 100 Å and a maximum of 230 Å at the completion of the main etching process, and an over-etching process following said main etching process for dry-etching the polycrystalline silicon film under existence of HBr and oxygen.

2. The method as defined in claim 1, wherein a flow rate of the $CF_4$ in the main etching process is between 30 and 50 sccm, and an ambient pressure is between 5 and 15 mTorr.

3. The method as defined in claim 1, wherein flow rates of the HBr and the oxygen in the over-etching process is between 100 and 200 sccm and between 1 and 3 sccm, respectively, and an ambient pressure is not less than 50 mTorr.

* * * * *